(12) United States Patent
Corbin et al.

(10) Patent No.: US 9,065,175 B2
(45) Date of Patent: Jun. 23, 2015

(54) ANTENNA STRUCTURES AND ELECTRICAL COMPONENTS WITH GROUNDING

(71) Applicant: Apple Inc., Cupertino, CA (US)

(72) Inventors: Sean S. Corbin, San Jose, CA (US); Taylor H. Gilbert, Sunnyvale, CA (US); Rodney A. Gomez Angulo, Sunnyvale, CA (US); Yi Jiang, Sunnyvale, CA (US); Conor P. Lenahan, Cupertino, CA (US); Qingxiang Li, Mountain View, CA (US); Stephen R. McClure, San Francisco, CA (US); Robert W. Schlub, Cupertino, CA (US); Salih Yarga, Sunnyvale, CA (US); Jiang Zhu, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 189 days.

(21) Appl. No.: 13/655,215

(22) Filed: Oct. 18, 2012

(65) Prior Publication Data

US 2014/0111684 A1   Apr. 24, 2014

(51) Int. Cl.
| | |
|---|---|
| *H04N 5/225* | (2006.01) |
| *H01Q 1/36* | (2006.01) |
| *H01Q 1/48* | (2006.01) |
| *H01Q 1/24* | (2006.01) |
| *H01Q 1/38* | (2006.01) |
| *H05K 1/02* | (2006.01) |
| *H05K 1/18* | (2006.01) |

(52) U.S. Cl.
CPC ............... *H01Q 1/243* (2013.01); *H01Q 1/38* (2013.01); *H05K 1/0215* (2013.01); *H05K 1/189* (2013.01); *H05K 2201/0281* (2013.01); *H05K 2201/10409* (2013.01); *H04N 5/2257* (2013.01)

(58) Field of Classification Search
CPC ............... F16M 13/022; F16M 11/10; F16M 2200/041; H01Q 1/243; H01Q 1/42; G06F 1/1626; G06F 1/1633; G06F 1/1656; G06F 1/1686; G06F 1/1688; G06F 1/1698; H04B 1/3816; H04M 1/026; H04R 1/02; H04R 1/101
USPC .......... 348/158, 373–374; 343/700, 767, 785, 343/845
See application file for complete search history.

(56) References Cited

U.S. PATENT DOCUMENTS

| | | | |
|---|---|---|---|
| 2007/0210969 A1* | 9/2007 | Vance | ............................ 343/702 |
| 2009/0295660 A1 | 12/2009 | Xu et al. | |
| 2010/0302110 A1 | 12/2010 | Leem | |
| 2010/0321255 A1 | 12/2010 | Kough et al. | |
| 2011/0012796 A1 | 1/2011 | Kim et al. | |
| 2012/0223866 A1 | 9/2012 | Ayala Vazquez et al. | |

OTHER PUBLICATIONS

Schlub et al., U.S. Appl. No. 13/420,278, filed Mar. 14, 2012.
Yarga et al., U.S. Appl. No. 13/468,289, filed May 10, 2012.
Yarga et al., U.S. Appl. No. 13/647,106, filed Oct. 8, 2012.

* cited by examiner

*Primary Examiner* — Trung Diep
(74) *Attorney, Agent, or Firm* — Treyz Law Group; G. Victor Treyz; Michael H. Lyons (57) ABSTRACT

An electronic device may have a conductive housing with an antenna window. Antenna structures may be mounted adjacent to the antenna window. The antenna structures may have a dielectric carrier. Patterned metal antenna traces may be formed on the surface of the dielectric carrier. A proximity sensor may be formed from a flexible printed circuit mounted on the dielectric carrier. The flexible printed circuit may have a tail that contains a transmission line for feeding the antenna structures. The transmission line may include a positive signal conductor that is maintained at a desired distance from the conductive housing using a polymer sheet. A portion of the antenna structures may protrude between a microphone and a camera module. Plastic camera module housing structures may have an inner surface coated with a shielding metal. A U-shaped conductive fabric layer may be used as a grounding structure.

23 Claims, 10 Drawing Sheets

ANTENNA STRUCTURES AND ELECTRICAL COMPONENTS WITH GROUNDING

BACKGROUND

This relates generally to electronic devices, and, more particularly, to grounding structures for antennas and components in electronic devices.

Electronic devices such as portable computers and handheld electronic devices are often provided with wireless communications capabilities. For example, electronic devices may use long-range wireless communications circuitry to communicate using cellular telephone bands. Electronic devices may use short-range wireless communications links to handle communications with nearby equipment. Electronic devices are also often provided with microphones, cameras, and other electronic components.

It can be difficult to incorporate antennas and electrical components successfully into an electronic device. Some electronic devices are manufactured with small form factors, so space is limited. In many electronic devices, the presence of conductive structures associated with components can influence the performance of antennas. There is also a potential for antenna disruptions from electromagnetic interference when antennas and electrical components are mounted in close proximity with insufficient grounding. This further restricts potential mounting arrangements for components and antennas.

It would therefore be desirable to be able to provide improved grounding arrangements for electronic devices with antennas and electronic components.

SUMMARY

An electronic device may have a conductive housing with an antenna window. A display module may be mounted within the conductive housing. A display cover layer may cover the display module. The inner surface of an inactive edge region of the display cover layer may be coated with a layer of opaque masking material. Antenna structures may be mounted adjacent to the antenna window under the layer of opaque masking material on the display cover layer.

The antenna structures may be formed from patterned metal traces on a dielectric carrier. The patterned metal traces may form an antenna resonating element with positive and ground feed terminals.

A flexible printed circuit may include a transmission line with positive and ground conductors respectively coupled to the positive and ground feed terminals. A proximity sensor may be formed from capacitive electrodes within the flexible printed circuit.

The flexible printed circuit may have a tail that contains the transmission line. The positive conductor in the transmission line may be maintained at a desired distance from the conductive housing a polymer sheet. Conductive structures such as screws and vias and other metal structures in the flexible printed circuit may be used to short the ground conductor in the transmission line to the conductive housing.

A portion of the antenna structures may protrude between a microphone and a camera module. The microphone may be mounted to a microphone flexible printed circuit. The camera module may be mounted to a camera flexible printed circuit. The conductive housing may have a vertical shielding wall that is adjacent to the antenna structures. The microphone flexible printed circuit and the camera flexible printed circuit may pass through the opening.

The camera module may have plastic camera module housing structures. An inner surface of the plastic camera module housing structures may be coated with a layer of metal that serves as an electromagnetic signal interference shield. A U-shaped conductive fabric layer may be used as a grounding structure. The conductive fabric layer may be interposed between the camera flexible printed circuit and the microphone flexible printed circuit adjacent to the opening in the vertical shielding wall.

Further features of the invention, its nature and various advantages will be more apparent from the accompanying drawings and the following detailed description of the preferred embodiments.

DETAILED DESCRIPTION

Electronic devices may be provided with antennas and electronic components such as microphones, cameras, sensors, and other electronic components. It may be desirable to mount components on flexible structures. For example, it may be desirable to mount a microphone, a camera, and other electronic components on flexible printed circuit structures. Flexible printed circuits, which are sometimes referred to as flex circuits, may include patterned metal traces on flexible substrates such as layers of polyimide or other flexible polymer sheets. Flexible printed circuits may be used in forming antennas, capacitive sensors (e.g., electrodes for a proximity sensor), assemblies that include antenna and capacitive sensor structures, other electronic device components, or combinations of these structures.

Figure 1:
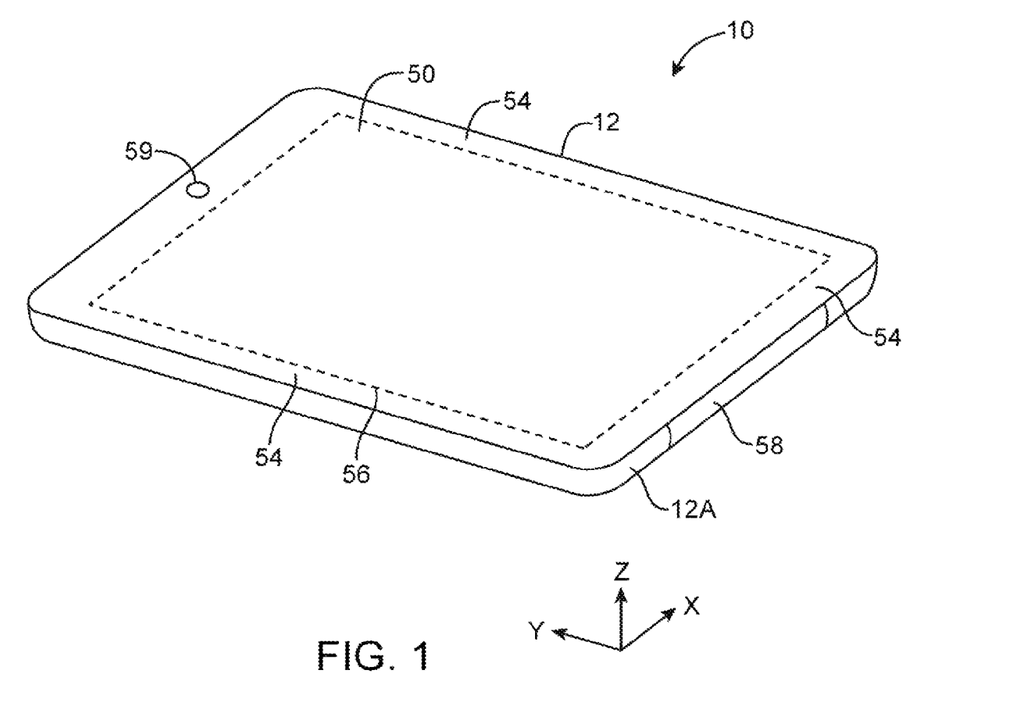
FIG. 1 is a front perspective view of an illustrative electronic device of the type that may be provided with grounding structures for antennas and components in accordance with an embodiment of the present invention.

An illustrative electronic device in which electronic components and antenna structures may be used is shown in FIG. 1. Device 10 may include one or more antenna resonating elements, one or more capacitive proximity sensor structures, one or more components that include antenna structures and proximity sensor structures, microphone structures, camera structures, and other electronic components. In the illustrative configuration of FIG. 1, device 10 has the shape of a portable device such as a cellular telephone or other handheld device, tablet computer, or other portable equipment. In general, electronic devices 10 may be desktop computers, computers integrated into computer monitors, portable computers, tablet computers, handheld devices, cellular telephones, wristwatch devices, pendant devices, other small or miniature devices, televisions, set-top boxes, or other electronic equipment.

As shown in FIG. 1, device 10 may have a display such as display 50. Display 50 may be mounted on a front (top) surface of device 10 or may be mounted elsewhere in device 10. Device 10 may have a housing such as housing 12. Housing 12 may have curved portions that form the edges of device 10 and a relatively planar portion that forms the rear surface of device 10 (as an example). Housing 12 may also have other shapes, if desired.

Housing 12 may be formed from conductive materials such as metal (e.g., aluminum, stainless steel, etc.), carbon-fiber composite material or other fiber-based composites, glass, ceramic, plastic, other materials, or combinations of these materials. A radio-frequency (RF) window (sometimes referred to as an antenna window) such as antenna window 58 may be formed in housing 12 (e.g., in a configuration in which the rest of housing 12 is formed from conductive structures). Window 58 may be formed from plastic, glass, ceramic, or other dielectric. Antenna and proximity sensor structures for device 10 may be formed in the vicinity of window 58, may be covered with dielectric portions of housing 12, and/or may be mounted under dielectric structures such as portions of a display cover layer or other dielectric display structure.

Device 10 may have user input-output devices such as button 59. Display 50 may be a touch screen display that is used in gathering user touch input. The surface of display 50 may be covered using a dielectric member such as a planar cover glass member or a clear layer of plastic or the outermost layer of display 50 may be formed from a portion of a color filter layer or other display layer. The central portion of display 50 (shown as region 56 in FIG. 1) may be an active region that contains an array of display pixels for displaying images and that is sensitive to touch input. The peripheral portion of display 50 such as region 54 may be an inactive region that is free from touch sensor electrodes and display pixels and that does not display images.

A layer of opaque masking material such as opaque ink or plastic may be placed on the underside of display 50 in peripheral region 54 (e.g., on the underside of the cover glass). This layer may be transparent to radio-frequency signals. The conductive touch sensor electrodes in region 56 and the conductive structures associated with the array of display pixels in region 56 may tend to block radio-frequency signals. However, radio-frequency signals may pass through the cover glass and the opaque masking layer in inactive display region 54 (as an example). Radio-frequency signals may also pass through antenna window 58 or dielectric housing walls in housing formed from dielectric material. Lower-frequency electromagnetic fields may also pass through dielectric structures such as portions of a display cover layer, window 58, or other dielectric housing structures, so capacitance measurements for a proximity sensor may be made through these dielectric structures.

With one suitable arrangement, housing 12 may be formed from a metal such as aluminum. Portions of housing 12 in the vicinity of antenna window 58 may be used as antenna ground. Antenna window 58 may be formed from a dielectric material such as polycarbonate (PC), acrylonitrile butadiene styrene (ABS), a PC/ABS blend, or other plastics (as examples). Window 58 may be attached to housing 12 using adhesive, fasteners, or other suitable attachment mechanisms. To ensure that device 10 has an attractive appearance, it may be desirable to form window 58 so that the exterior surfaces of window 58 conform to the edge profile exhibited by housing 12 in other portions of device 10. For example, if housing 12 has straight edges 12A and a flat bottom surface, window 58 may be formed with a right-angle bend and vertical sidewalls. If housing 12 has curved edges 12A, window 58 may have a similarly curved exterior surface along the edge of device 10.

Figure 2:
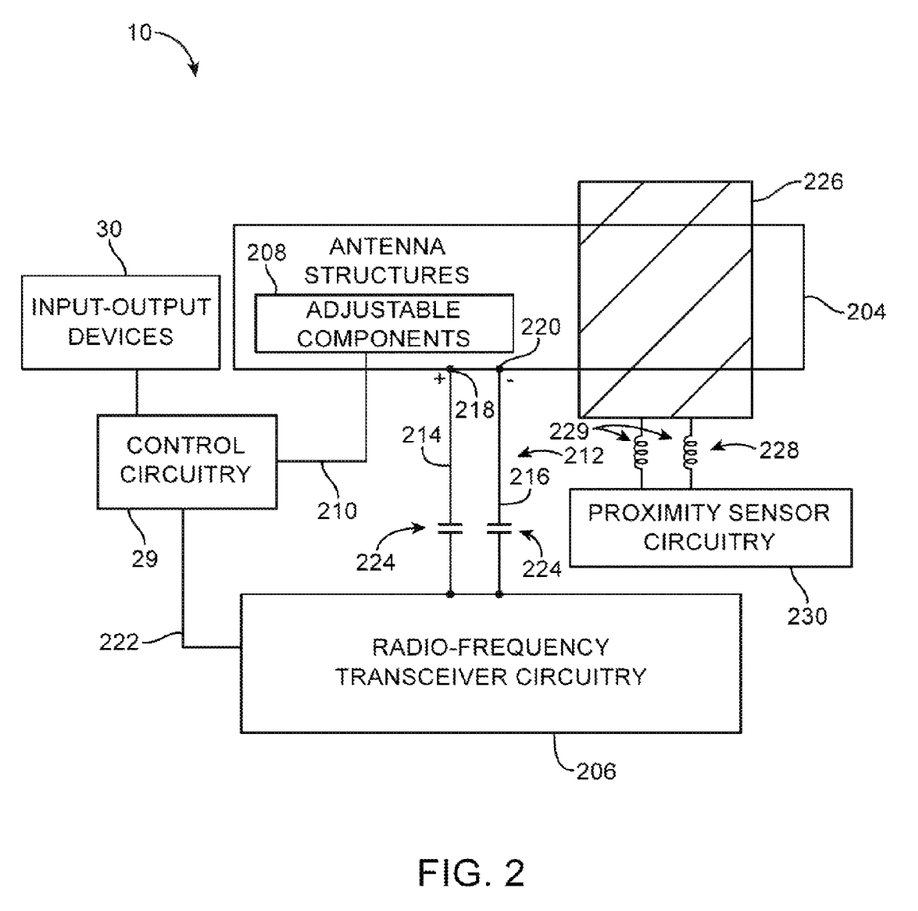
FIG. 2 is a diagram showing circuitry that may be used to operate antenna structures and proximity sensor structures in accordance with an embodiment of the present invention.

A schematic diagram of an illustrative configuration that may be used for electronic device 10 is shown in FIG. 2. As shown in FIG. 2, electronic device 10 may include control circuitry 29. Control circuitry 29 may include storage and processing circuitry for controlling the operation of device 10. Control circuitry 29 may, for example, include storage such as hard disk drive storage, nonvolatile memory (e.g., flash memory or other electrically-programmable-read-only memory configured to form a solid state drive), volatile memory (e.g., static or dynamic random-access-memory), etc. Control circuitry 29 may include processing circuitry based on one or more microprocessors, microcontrollers, digital signal processors, baseband processors, power management units, audio codec chips, application specific integrated circuits, etc.

Control circuitry 29 may be used to run software on device 10, such as operating system software and application software. Using this software, control circuitry 29 may, for example, transmit and receive wireless data, tune antennas to cover communications bands of interest, process proximity sensor signals, adjust radio-frequency transmit powers based on proximity sensor data, and perform other functions related to the operation of device 10.

Input-output devices 30 may be used to allow data to be supplied to device 10 and to allow data to be provided from device 10 to external devices. Input-output circuitry 30 may include communications circuitry such as wired communications circuitry. Device 10 may also use wireless circuitry such as radio-frequency transceiver circuitry 206 and antenna structures 204 to communicate over one or more wireless communications bands.

Input-output devices 30 may also include input-output components with which a user can control the operation of device 10. A user may, for example, supply commands through input-output devices 30 and may receive status information and other output from device 10 using the output resources of input-output devices 30.

Input-output devices 30 may include sensors and status indicators such as an ambient light sensor, a proximity sensor, a temperature sensor, a pressure sensor, a magnetic sensor, an accelerometer, and light-emitting diodes and other components for gathering information about the environment in which device 10 is operating and providing information to a user of device 10 about the status of device 10. Audio components in devices 30 may include speakers and tone generators for presenting sound to a user of device 10 and microphones for gathering user audio input. Devices 30 may include one or more displays such as display 50. Displays may be used to present images for a user such as text, video, and still images. Sensors in devices 30 may include a touch sensor array that is formed as one of the layers in display 50. During operation, user input may be gathered using buttons and other input-output components in devices 30 such as touch pad sensors, buttons, joysticks, click wheels, scrolling wheels, touch sensors such as a touch sensor array in a touch screen display or a touch pad, key pads, keyboards, vibrators, cameras, and other input-output components.

Device 10 may include wireless communications circuitry such as radio-frequency transceiver circuitry 206, power amplifier circuitry, low-noise input amplifiers, passive radio frequency components, one or more antennas such as antenna structures 204, and other circuitry for handling radio frequency wireless signals. The wireless communications circuitry may include radio-frequency transceiver circuits for handling multiple radio-frequency communications bands. For example, wireless communications circuitry in device 10 may include transceiver circuitry 206 for handling cellular telephone communications, wireless local area network signals, and satellite navigation system signals such as signals at 1575 MHz from satellites associated with the Global Positioning System. Transceiver circuitry 206 may handle 2.4 GHz and 5 GHz bands for WiFi® (IEEE 802.11) communications and may handle the 2.4 GHz Bluetooth® communications band. Circuitry 206 may use cellular telephone transceiver circuitry for handling wireless communications in cellular telephone bands such as the bands in the range of 700 MHz to 2.7 GHz (as examples).

The wireless communications circuitry in device 10 can include circuitry for other short-range and long-range wireless links if desired. For example, wireless communications circuitry in device 10 may include wireless circuitry for receiving radio and television signals, paging circuits, etc. In WiFi® and Bluetooth® links and other short-range wireless links, wireless signals are typically used to convey data over tens or hundreds of feet. In cellular telephone links and other long-range links, wireless signals are typically used to convey data over thousands of feet or miles.

Antenna structures 204 may include one or more antennas. Antenna structures 204 may include inverted-F antennas, patch antennas, loop antennas, monopoles, dipoles, single-band antennas, dual-band antennas, antennas that cover more than two bands, or other suitable antennas. As an example, device 10 may include one or more antennas such as dual band inverted-F antennas formed from metal structures supported by a dielectric carrier.

To provide antenna structures 204 with the ability to cover communications frequencies of interest, antenna structures 204 may be provided with tunable circuitry 208. Tunable circuitry 208 may be controlled by control signals from control circuitry 29. For example, control circuitry 29 may supply control signals to tunable circuitry 208 using control path 210 whenever it is desired to tune antenna structures 204 to cover a desired communications band during operation of device 10. Path 222 may be used to convey data between control circuitry 29 and radio-frequency transceiver circuitry 206 (e.g., when transmitting wireless data or when receiving and processing wireless data).

Transceiver circuitry 206 may be coupled to antenna structures 204 by signal paths such as signal path 212. Signal path 212 may include one or more transmission lines. As an example, signal path 212 of FIG. 2 may be a transmission line having a positive signal conductor such as line 214 and a ground signal conductor such as line 216. Lines 214 and 216 may form parts of a coaxial cable, parts of a microstrip transmission line, or parts of other transmission line structures.

The impedance of transmission line 212 may be 50 ohms (as an example). A matching network formed from components such as inductors, resistors, and capacitors may be used in matching the impedance of antenna structures 204 to the impedance of transmission line 212. Matching network components may be provided as discrete components (e.g., surface mount technology components) or may be formed from housing structures, printed circuit board structures, traces on plastic supports, etc.

Transmission line 212 may be coupled to antenna feed structures associated with antenna structures 204. As an example, antenna structures 204 may include an inverted-F antenna having an antenna feed with a positive antenna feed terminal such as terminal 218 and a ground antenna feed terminal such as ground antenna feed terminal 220. Positive transmission line conductor 214 may be coupled to positive antenna feed terminal 218 and ground transmission line conductor 216 may be coupled to ground antenna feed terminal 220. Other types of antenna feed arrangements may be used if desired. The illustrative feeding configuration of FIG. 2 is merely illustrative.

Filter circuitry such as direct current (DC) blocking capacitors 224 may, if desired, be interposed within paths 214 and 216. Capacitors 224 may help prevent signals at low frequencies (e.g., frequencies below the lowest frequencies used by antenna structures 204 in transmitting and receiving wireless data) from reaching transceiver circuitry 206 and potentially interfering with the operation of radio-frequency transceiver circuitry 206.

Tunable circuitry 208 may be formed from one or more tunable circuits such as circuits based on capacitors, resistors, inductors, and switches. Tunable circuitry 208 may be implemented using discrete components mounted to a substrate such as a rigid printed circuit board (e.g., a printed circuit board formed from glass-filled epoxy), a flexible printed circuit formed from a sheet of polyimide or a layer of other flexible polymer, a plastic carrier, a glass carrier, a ceramic carrier, or other dielectric support. With one suitable arrangement, tunable circuitry 208 may include an inductor-based tunable component (e.g., a component having one or more inductors in parallel and a switch that can be configured to selectively switch one or more of the inductors into use). An inductor-based tunable component of this type (e.g., a switchable inductor component) may be coupled between one or more of the arms in a dual arm inverted-F antenna and a ground plane or may otherwise be used in tuning the performance of antenna structures 204.

As shown in FIG. 2, device 10 may include a proximity sensor that includes proximity sensor electrode structures 226. Proximity sensor electrode structures 226 may include one or more or two or more layers of metal electrodes for sensing capacitance changes in the surroundings of device 10. If desired, proximity sensor electrode structures 226 may be formed from metal traces on a flexible printed circuit or other dielectric carrier. The flexible printed circuit may be mounted within device 10 so as to surround or at least partly overlap antenna structures 204, as shown in FIG. 2. With this type of arrangement, proximity sensor electrode structures 226 and antenna structures 204 may experience similar environments. This allows the proximity sensor to monitor the vicinity of antenna structures 204 for external objects such as part of a user's body. Proximity sensor signals that indicate that the user's body is present in the vicinity of antenna structures 204 may then be used to limit transmitted radio-frequency signal power from radio-frequency transceiver circuitry 206 to ensure that device 10 satisfies regulatory limits on transmitted wireless signal powers.

Proximity sensor circuitry 230 may be coupled to proximity sensor electrode 226 by path 228. Inductors 229 or other filter circuitry for blocking high-frequency signals may be interposed in path 228. The presence of high-frequency signal blocking circuitry in path 228 may help prevent radio-frequency antenna signals that are associated with antenna structures 204 from being conveyed to proximity sensor circuitry 230. Proximity sensor circuitry 228 can receive proximity sensor signals (e.g., lower frequency signals) from electrode structures 226 through inductors 229 and can determine whether or not external objects are present in the vicinity of structures 226 based on these proximity sensor signals. For example, if a user places a body part in the vicinity of proximity sensor electrode 226, the capacitance of sensor electrode 226 may vary and, by monitoring these capacitance fluctuations, circuitry 230 can detect the presence of the body part.

Figure 3:
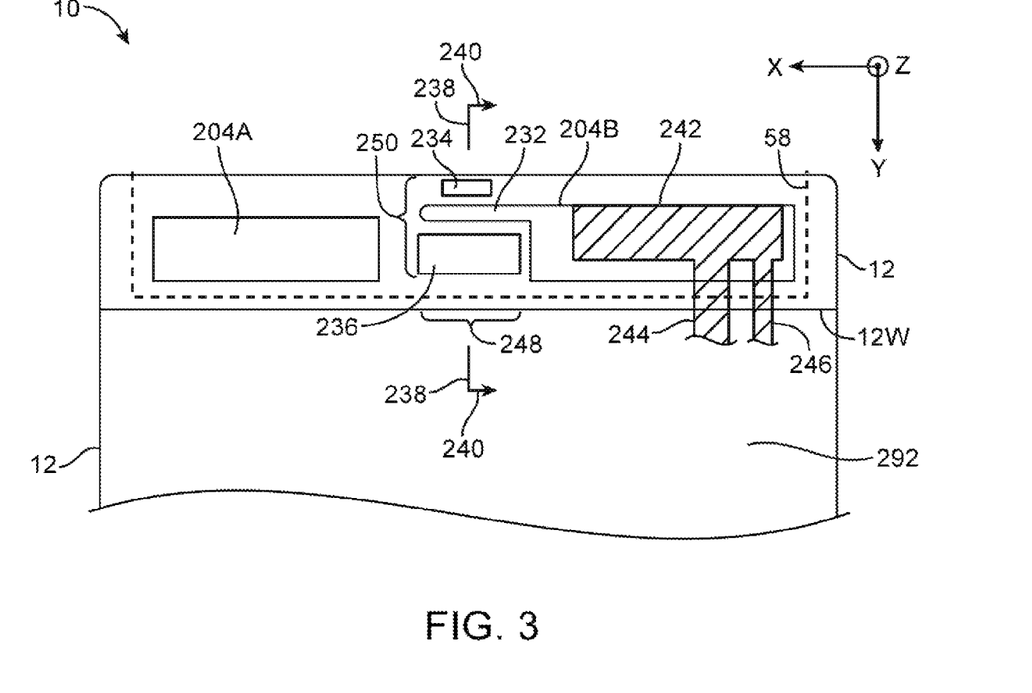
FIG. 3 is a top view of an end portion of an electronic device housing containing two antennas in accordance with an embodiment of the present invention.

FIG. 3 is a top view of an end portion of device 10 of FIG. 1. In the illustrative configuration of FIG. 3, device 10 includes at least two antennas such as first antenna 204A and second antenna 204B. Antennas 204A and 204B may be, for example, inverted-F antennas that are used in handling cellular telephone communications. This is, however, merely illustrative. Antennas 204A and 204B may, in general, be configured to handle communications in any communications bands of interest and may use any suitable type of antenna resonating element structure. Additional antennas may be included in device 10, if desired. For example, wireless local area network antennas may be located at an opposing end of device 10.

In a configuration of the type shown in FIG. 3 in which there are at least two antennas in device 10, the two antennas may be used as part of a multiple input multiple output (MIMO) antenna scheme or may be used as part of an antenna diversity arrangement in which control circuitry 29 (FIG. 2) switches one of the two antennas into use in real time depending on signal quality criteria or other suitable switching criteria. Antennas in device 10 may be fixed and/or tunable. For example, antenna 204B may be a fixed primary antenna that is used for transmitting and receiving wireless signals, whereas antenna 204A may be a tunable secondary antenna that is used exclusively or primarily for receiving wireless signals.

Proximity sensor structures such as proximity sensor electrode structures 226 of FIG. 2 may be implemented using a flexible printed circuit such as flexible printed circuit 242. Flexible printed circuit 242 may include metal traces for implementing transmission line 212 of FIG. 2, traces for mounting components such as filter capacitors 224 and filter inductors 229, metal structures for coupling transmission line 212 to antenna terminals 218 and 220 of FIG. 2, and other conductive structures. Conductive metal traces or other conductive structures for forming antenna structures 204B may be formed on the surface of a dielectric carrier or on a printed circuit. In a configuration in which patterned metal antenna traces are formed on the surface of a carrier, the carrier may, for example, be a plastic carrier having a protruding portion such as portion 232 of FIG. 3.

Tail portions 244 and 246 of flexible printed circuit 242 may extend over housing structures such as housing wall structures 12W of housing 12. The presence of tail portions 244 and 246 helps accommodate movement of antenna structures coupled to flexible printed circuit 242 relative to housing 12. Housing wall structures 12W may be a metal wall that extends vertically (out of the page in the orientation of FIG. 3) from the rear surface of housing 12. Housing wall structures 12W may be interposed between antenna structures 204A and 204B and device circuitry located in interior portion 292 of device 10 and may therefore serve as a part of an electromagnetic interference shield.

Device 10 may include components such as microphone 234 and camera 236. In region 250, microphone 234 may be mounted on a flexible printed circuit (sometimes referred to as a microphone flexible printed circuit) and camera 236 may be mounted on a flexible printed circuit (sometimes referred to as a camera flexible printed circuit). The microphone and camera flexible printed circuits may run along the inner surface of antenna window 58 and through an opening in portion 248 of inner housing wall 12W (e.g., a mousehole opening).

Figure 4:
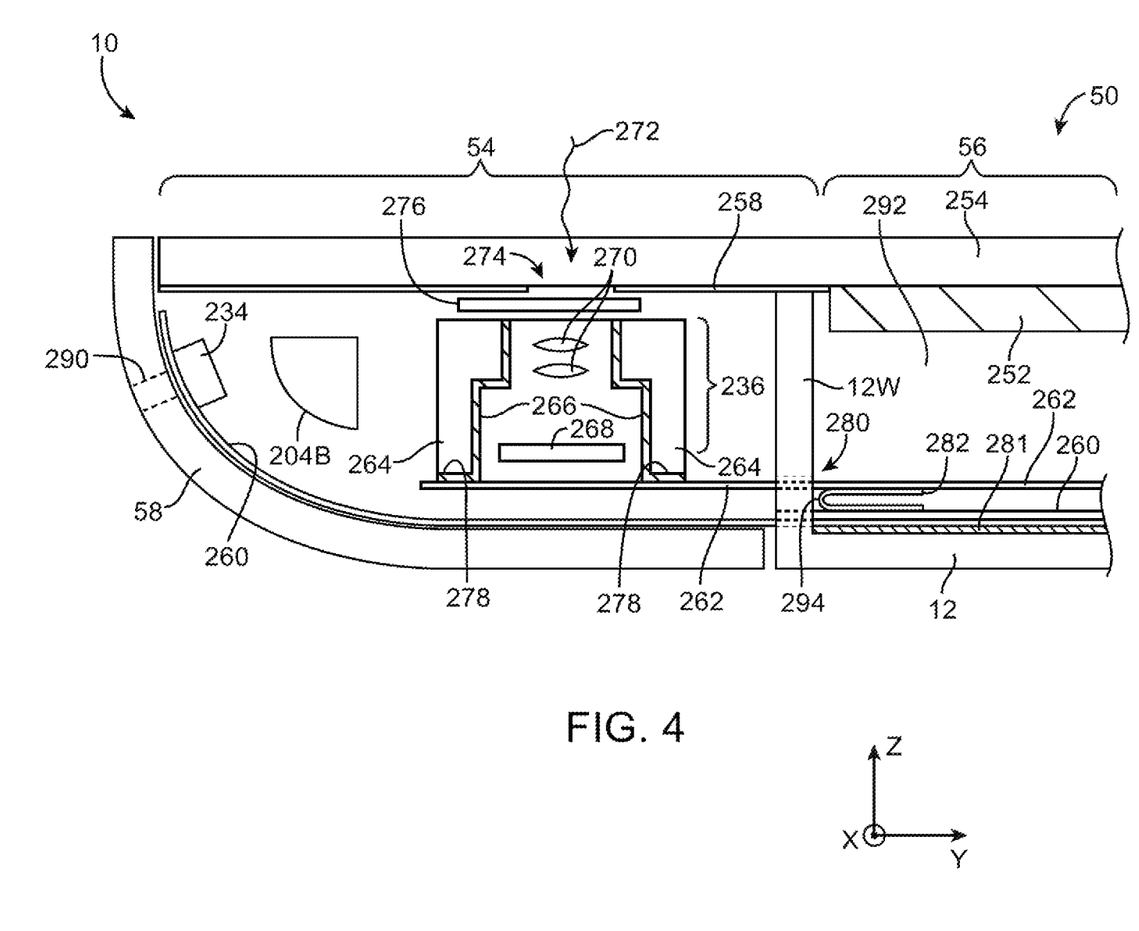
FIG. 4 is a cross-sectional side view of a portion of an electronic device taken through a microphone and camera module with grounding structures in accordance with an embodiment of the present invention.

A cross-sectional side view of microphone 234 and camera 236 in device 10 taken along line 238 and viewed in direction 240 is shown in FIG. 4. As shown in FIG. 4, device 10 may have a display cover layer such as display cover layer 254. Display module 252 may be mounted in active region 56 of display 50 for producing images for user of device 10. In inactive region 54, a layer of opaque masking material such as opaque masking layer 258 may be formed on the underside of display cover layer 254 to hide internal components from view. Camera 236 (sometimes referred to as a camera module) may be mounted under opening 274 in opaque masking layer 258 using mounting structures such as mounting ring 276. During operation of camera 236, image light 272 may be received through opening 274. Optical structures such as lenses 270 may focus incoming light 272 onto digital image sensor 268 (e.g., a digital imaging sensor implemented on an integrated circuit).

Camera module 236 may be provided with camera housing walls such as walls 264. Housing structures such as walls 264 may be formed from one or more structures. For example, housing walls 264 may be formed from molded and/or machined plastic parts. To help electrically isolate internal portions of camera 236 such as image sensor 268 from antenna structures in device 10 such as antenna structures 204 of FIG. 4, camera module 236 may be provided with shielding structures. The shielding structures may be formed form a metal coating on the inside or outside surfaces of camera module 236.

As an example, metal coating 266 may be formed on the inner surfaces of plastic walls 264 of camera module 264. Metal coating 266 may be formed by physical vapor deposition techniques, electroplating, or other suitable fabrication techniques. Portions 278 of metal coating layer 266 may be formed on the lower surfaces of camera module housing 264 and may be electrically coupled to a substrate such as camera flexible printed circuit 262. For example, solder, conductive adhesive, conductive tape, conductive foam, or other conductive materials may be used to short metal layer 266 of camera module 236 to ground path metal traces on camera flexible printed circuit 262.

Microphone 234 may be mounted on microphone flexible printed circuit 260. Signal lines on flexible printed circuit 260 may be used to gather microphone signals from microphone 234. Microphone 234 may receive sound through opening 290 in antenna window 58 or other portions of the housing for device 10. Antenna window 58 may have a curved cross-sectional shape of the type shown in FIG. 4 and may form part of the housing of device 10.

Microphone flexible printed circuit 260 and camera flexible printed circuit 262 may extend through an opening such as opening 280 in housing wall 12W (e.g., an opening in region 248 of wall 12W of FIG. 3). Housing 12 and housing wall 12W may be formed from a metal such as aluminum and may serve as a ground for circuitry and components in device 10. If desired, housing wall 12W may be a machined feature that is an integral portion of the machined metal structures used to form housing 12.

To help ground structures in device 10 and thereby allow antenna structures 204B to function satisfactorily, the structures of FIG. 4 such as camera 236, camera flexible printed circuit 262, microphone 234, and microphone flexible printed circuit 260 may be grounded to housing 12 or other suitable ground structures. Grounding structures 282 may, for example, be used to ground camera flexible printed circuit 262 to microphone flexible printed circuit 260.

Grounding structures 282 may be formed from a conductive material such as a conductive fabric. Microphone flexible printed circuit 260 may be grounded to housing 12 directly or through intervening structures such as audio jack flexible printed circuit 281. The presence of grounding structures 282 such as end portion 294 of grounding structures 282 may help reduce electromagnetic interference by helping to prevent antenna signals from antenna 204B from entering interior portion 292 of device 10 through opening 280 and by helping to prevent interference signals from interior 292 from reaching antenna 204B through opening 280. In effect, portion 294 of grounding structures 282 helps seal opening 280 in metal shielding wall 12W.

Figure 5:
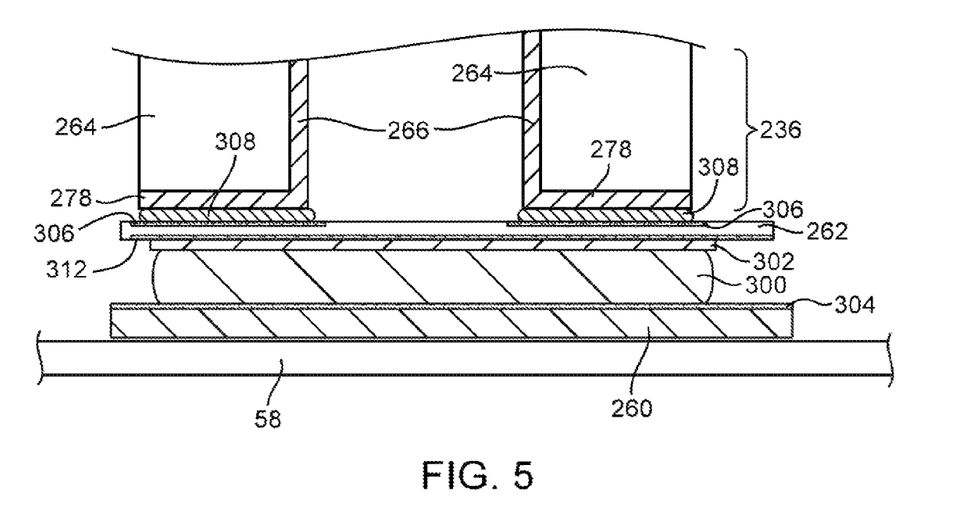
FIG. 5 is a cross-sectional side view of a portion of a camera module and associated flexible printed circuit structures in accordance with an embodiment of the present invention.

FIG. 5 is a cross-sectional side view of a portion of camera 236 and associated flexible printed circuit structures such as camera flexible printed circuit 262 and microphone flexible printed circuit 260. As shown in FIG. 5, metal portions 278 of metal shielding coating 266 on camera module housing structures 264 may be shorted to metal traces 306 in camera flexible printed circuit 262 using conductive adhesive 308. Metal traces 306 may be, for example, ground traces in camera flexible printed circuit 262.

A biasing structure such as conductive foam 300 may be used to press camera module 236 upwards towards display cover layer 254 while compressing structures such as camera flexible printed circuit 262 and microphone flexible printed circuit 260 downwards against antenna window 58. Conductive structures such as a sheet of stainless steel or other stiffener 302 may be provided between metal ground traces such a traces 312 in camera flexible printed circuit 262 and conductive foam 300. Stiffener 302 may provide localized structural support for flexible printed circuit 260. Traces 312 may be shorted to traces 306 (e.g., using vias or other paths), so that traces 312 serve as ground traces. Metal traces 304 on microphone printed circuit 260 may be shorted to the ground traces on camera flexible printed circuit 262 and therefore to shield 266 in camera module 236 through conductive foam 300. If desired, conductive adhesive may be interposed between stiffener 302 and traces 312 and/or between stiffener 302 and conductive foam 300. Conductive adhesive may optionally also be interposed between traces 304 and conductive foam 300.

Figure 6:
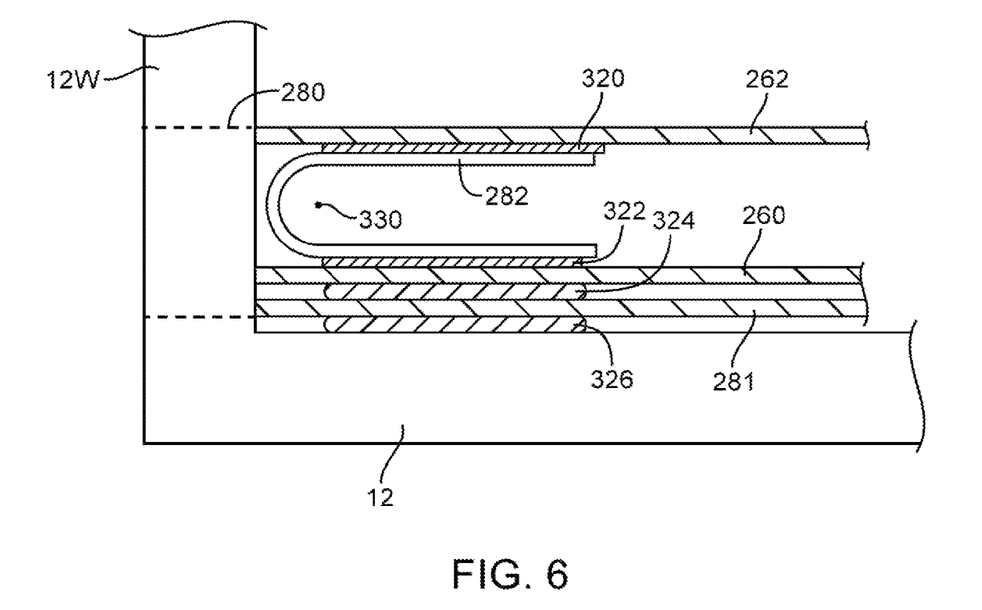
FIG. 6 is a cross-sectional side view of a portion of an electronic device showing how a U-shaped conductive fabric gasket may be used in shorting together adjacent flexible printed circuits as part of a grounding arrangement in accordance with an embodiment of the present invention.

FIG. 6 is a cross-sectional side view of grounding structures 282 and associated structures in the vicinity of internal housing wall 12W. As shown in FIG. 6, grounding structures 282 may have a U-shaped cross section. U-shaped grounding structures 282 may be formed from a sheet of conductive fabric that is bent around bend axis 330. If desired, other shapes such as tube shapes, corrugated shapes formed from an undulating fabric sheet, or other configurations may be used for grounding structures 282.

Conductive fabric for grounding structures 282 may be formed from metal fibers, plastic fibers coated with metal, a combination of metal and plastic fibers, or other suitable conductive fibers. Camera flexible printed circuit 262 may have ground traces that are shorted to grounding structures 282 using conductive adhesive 320. Conductive adhesive 322 may be used to attach grounding structure 282 to ground conductive ground traces in microphone flexible printed circuit 260. Conductive adhesive 324 may be used to short the ground traces of microphone flexible printed circuit 260 to metal ground traces in a printed circuit such as audio jack flexible printed circuit 281. Conductive adhesive 326 may be interposed between audio jack flexible printed circuit 281 and the inner surface of metal housing 12. Metal housing 12 may serve as ground. If desired, one or more of the conductive adhesive layers of FIG. 6 may be omitted and/or other conductive structures (e.g., solder, conductive fabric, conductive metal tape, welds, fasteners, metal paint, etc.) may be used in electrically coupling and thereby grounding the layers of FIG. 6.

Figure 7:
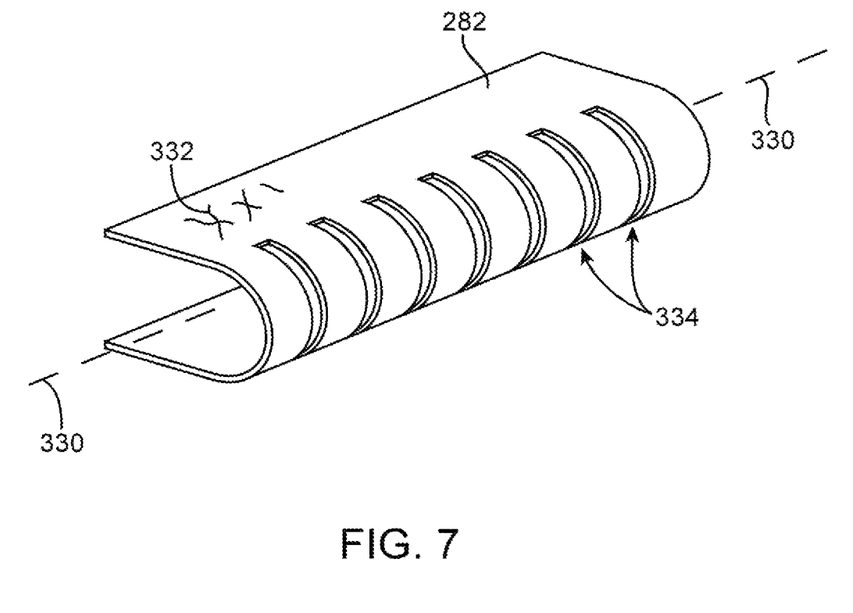
FIG. 7 is a perspective view of an illustrative grounding structure of the type that may be used in an electronic device in accordance with an embodiment of the present invention.

FIG. 7 is a perspective view of grounding structures 282 in an illustrative U-shaped configuration. As shown in FIG. 7, grounding structures 282 may be formed from a conductive fabric having conductive fibers such as fibers 332. Structure 282 may be formed from a bent sheet of conductive fabric or conductive fabric having other suitable shapes. Openings 334 may be formed in structure 282 along bend axis 330 to facilitate bending of structure 282 around bend axis 330. If desired, a tube or a structure with other shapes may be formed from conductive fabric having fibers 332. The U-shaped structure of FIG. 7 is merely illustrative.

Figure 8:
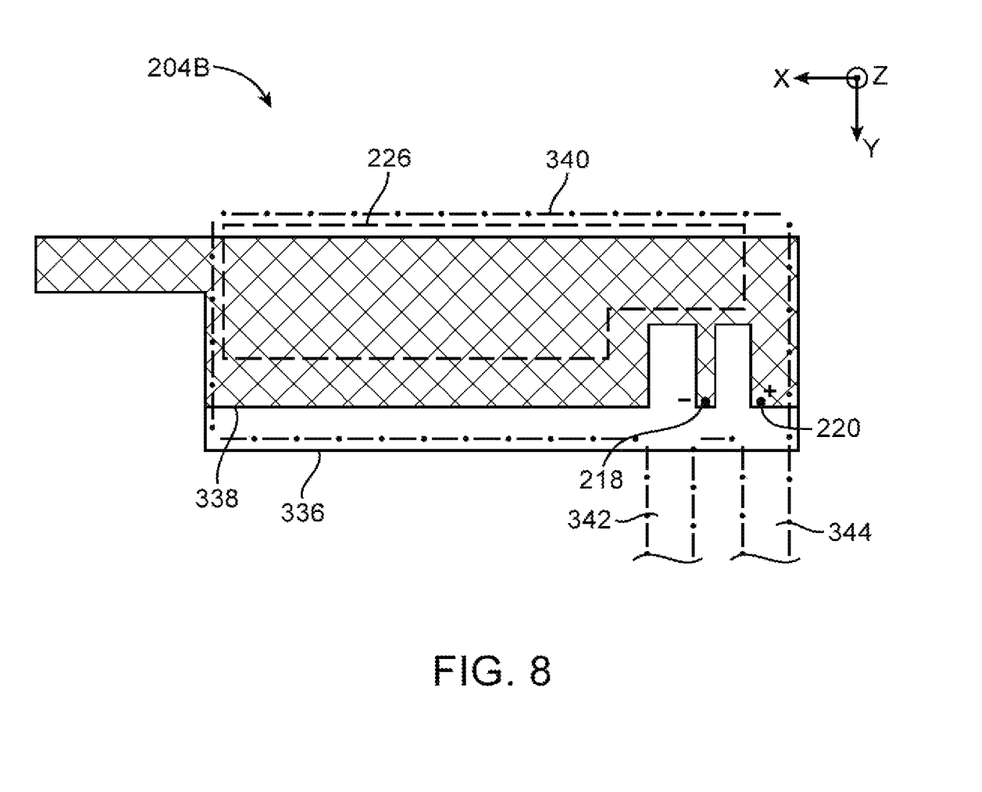
FIG. 8 is a top view of an illustrative antenna having a carrier that is used in forming an antenna support and a support for a proximity sensor flexible printed circuit in accordance with an embodiment of the present invention.

FIG. 8 is a top view of antenna structures 204B. In the illustrative configuration of FIG. 8, antenna structures 204B have a dielectric carrier such as carrier 336. Carrier 336 may be formed from plastic, glass, ceramic, printed circuit board material, or other suitable dielectric material. Patterned conductive antenna resonating element traces 338 may be formed on the surface of dielectric carrier 336 (e.g., using selective surface activation and electroplating such as used in laser direct structuring techniques). Antenna feed terminals 218 and 220 may be formed from pad-shaped structures or other structures in the patterned metal coating on carrier 336.

Proximity sensor electrode structures 226 may be formed from metal traces within flexible printed circuit 340. Tail portion 342 of flexible printed circuit 340 may contain transmission line 212 of FIG. 2. Vias and hot bar solder connections may be used to couple transmission line positive conductor 214 to terminal 218 in the metal traces on the surface of carrier 336 and to couple transmission line ground conductor 216 to terminal 220 in the metal traces on the surface of carrier 336. Patterned metal traces 338 may cover some or all of the surfaces of carrier 336 to form an inverted-F antenna resonating element or an antenna resonating element of another suitable type.

Figure 9:
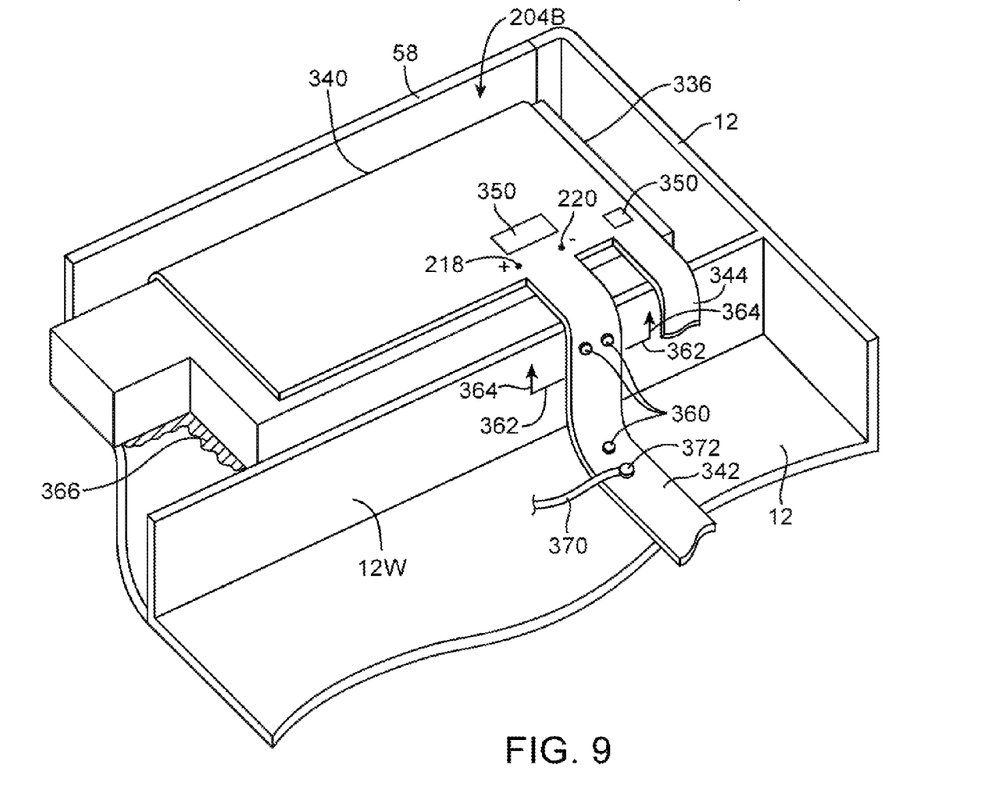
FIG. 9 is a perspective view of a portion of an electronic device having an antenna with a grounded transmission line in accordance with an embodiment of the present invention.

A perspective view of antenna structures 204B mounted in device 10 is shown in FIG. 9. As shown in FIG. 9, foam such as foam 366 may be used to bias antenna structures 204B upwards towards display cover layer 254 (FIG. 4). The biasing force produced by foam 366 may help ensure that antenna structures 204B are placed at a well-defined location relative to the dielectric of display cover layer 254. By placing antenna structures 204B at this well-defined location, fluctuations in the performance of antenna structures 204B due to placement variations within device 10 can be minimized.

Components 350 may be mounted on flexible printed circuit 340. Components 350 may include capacitors such as capacitors 224 of FIG. 2, inductors such as inductors 229 in path 228 in FIG. 2, switches, inductors, capacitors, and other components that are associated with adjustable components 208 (e.g., in a scenario in which the antenna structures are tunable), matching circuit components, or other circuitry.

Coaxial cable 370 may be connected to transmission line conductors in flexible printed circuit tail 342 of flexible printed circuit 340 using connector 372. Cable 370 may form part of transmission line 212 (FIG. 2). The transmission line conductors within tail portion 342 of flexible printed circuit 340 may be implemented using a microstrip transmission line, a stripline transmission line, or other printed circuit transmission line structure. The ground traces in the microstrip transmission line may be shorted to housing 12 and vertical housing wall 12W. For example, fasteners such as screws 360 or other conductive structures may be used to couple the ground traces of protruding tail portion 342 of flexible printed circuit 340 to housing 12.

Figure 10:
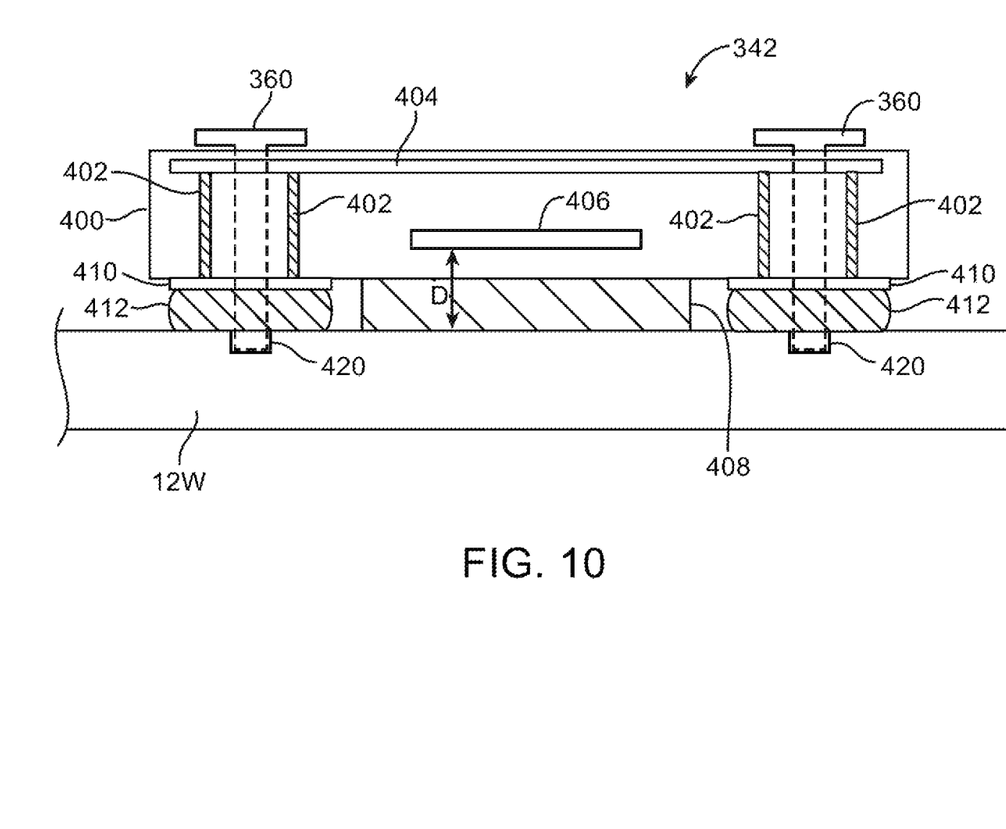
FIG. 10 is a cross-sectional side view of a transmission line for an antenna having grounding structures in accordance with an embodiment of the present invention.

FIG. 10 is a cross-sectional side view of tail portion 342 of flexible printed circuit 340 taken along line 362 of FIG. 9 and viewed in direction 364. As shown in FIG. 10, transmission line 212 of FIG. 2 may be formed from conductive structures such as positive signal conductor 406 and ground signal conductor 404. Conductor 406 may be a metal trace that serves as positive transmission line conductor 214 of FIG. 2. Conductor 404 may be a metal trace that serves as ground transmission line conductor 216 of FIG. 2. Dielectric such as polymer layer 400 may serve as a substrate for flexible printed circuit 340. Layer 400 may be formed from a material such as polyimide or other flexible printed circuit substrate material.

To ground traces such as trace 404 to housing structures such as metal housing structure 12W, screws 360 may be coupled between trace 404 (and if desired, traces on the surface of substrate 400 that are coupled to trace 404) and housing 12. Screws 360 may have threaded shafts with tips that screw into threaded holes in housing 12W such as holes 420. Vias 402 may be used to short ground conductor trace 404 to traces forming contact pads 410. Conductive structures 412 (e.g., foam, conductive fabric, conductive adhesive, or other conductive materials) may be used to short pads 410 (and therefore ground trace 404) to a ground structure such as housing 12W.

Dielectric member 408 may be formed from a strip of polymer such as biaxially-oriented polyethylene terephthalate or polyester films. The thickness of film 408 may be selected to establish a desired separation D between positive signal conductor trace 406 and ground structures 12W. As an example, dielectric film 408 may have a thickness of 200 microns (or 100-300 microns or other thickness) and the distance between film 408 and conductor 406 may be 50 microns, thereby establishing a fixed separation of 250 microns between ground structures 12W and conductor 406. With a satisfactorily fixed and known distance D, the impedance of the transmission line that is formed using the structures of FIG. 10 may be maintained at a desired value such as 50 ohms.

The foregoing is merely illustrative of the principles of this invention and various modifications can be made by those skilled in the art without departing from the scope and spirit of the invention.

What is claimed is:

1. Apparatus, comprising:
   a metal electronic device housing;
   a dielectric carrier having antenna traces;
   a flexible printed circuit that is coupled to the antenna traces at antenna feed terminals, wherein the flexible printed circuit has a protruding tail;
   a transmission line in the tail that is coupled to the antenna feed terminals, wherein the transmission line has a signal conductor and a ground conductor; and
   conductive structures that couple the ground conductor to the metal electronic device housing.

2. The apparatus defined in claim 1 wherein the conductive structures include at least one screw.

3. The apparatus defined in claim 1 further comprising a proximity sensor electrode in the flexible printed circuit.

4. The apparatus defined in claim 3 wherein the metal electronic device housing comprises an internal metal wall and wherein a screw is used to attach the protruding tail to the internal metal wall.

5. The apparatus defined in claim 4 further comprising a camera flexible printed circuit and a camera module mounted on the camera flexible printed circuit, wherein the internal metal wall has an opening through which the camera flexible printed circuit passes.

6. The apparatus defined in claim 5 further comprising a microphone flexible printed circuit and a microphone mounted to the microphone flexible printed circuit, wherein the microphone flexible printed circuit passes through the opening.

7. The apparatus defined in claim 6 further comprising a grounding structure that electrically couples the camera flexible printed circuit to the microphone flexible printed circuit.

8. The apparatus defined in claim 7 wherein the grounding structure comprises conductive fabric.

9. The apparatus defined in claim 1 further comprising a plurality of flexible printed circuits and a conductive fabric grounding structure that electrically couples the flexible printed circuits.

10. The apparatus defined in claim 9 wherein the conductive fabric grounding structure comprises a layer of conductive fabric that is bent around a bend axis into a U-shape.

11. The apparatus defined in claim 1, further comprising:
   radio-frequency transceiver circuitry; and
   an additional transmission line structure coupled to the transmission line in the protruding tail, wherein the additional transmission line structure is configured to convey radio-frequency signals between the radio-frequency transceiver circuitry and the transmission line in the tail.

12. The apparatus defined in claim 1, wherein the signal conductor of the transmission line in the protruding tail is interposed between the ground conductor of the transmission line in the protruding tail and the metal electronic device housing.

13. The apparatus defined in claim 12, further comprising first and second screws that attach the protruding tail portion to the metal electronic device housing.

14. The apparatus defined in claim 13, wherein the first and second screws electrically couple the ground conductor to the metal electronic device housing and wherein the first and second screws are formed on opposing sides of the signal conductor.

15. The apparatus defined in claim 14, wherein the protruding tail portion of the flexible printed circuit comprises a dielectric substrate, the signal conductor and the ground conductor are formed in the dielectric substrate, the first screw is formed within a first via in the dielectric substrate and the second screw is formed within a second via in the dielectric substrate, the apparatus further comprising conductive contact pads and conductive foam interposed between the dielectric substrate and the metal electronic device housing.

16. An electronic device, comprising:
   a metal housing;
   a dielectric antenna window mounted within the metal housing;
   an antenna carrier adjacent to the dielectric antenna window;
   antenna traces on the antenna carrier;

a proximity sensor formed from at least one proximity sensor electrode that overlaps at least some of the antenna traces, wherein the proximity sensor electrode includes metal traces on a flexible printed circuit; and a transmission line that is coupled to the antenna traces, wherein the transmission line includes a positive signal conductor and a ground signal conductor in the flexible printed circuit and wherein the ground signal conductor is shorted to the metal housing.

17. The electronic device defined in claim 16 wherein the metal housing has an opening, the electronic device further comprising conductive fabric grounding structures adjacent the opening.

18. The electronic device defined in claim 17 wherein the conductive fabric grounding structures include a U-shaped conductive fabric layer.

19. The electronic device defined in claim 18 further comprising a polymer sheet located between the flexible printed circuit and the metal housing that places the positive signal conductor at a desired distance from the metal housing.

20. The electronic device defined in claim 16, further comprising:

control circuitry that is configured to process proximity sensor signals received from the proximity sensor electrode to determine whether external objects are present within a vicinity of the proximity sensor electrode.

21. Apparatus, comprising:

a metal electronic device housing;

a dielectric carrier having antenna traces;

a flexible printed circuit that is coupled to the antenna traces at antenna feed terminals, wherein the flexible printed circuit has a protruding tail;

a transmission line in the tail that is coupled to the antenna feed terminals, wherein the transmission line has a signal conductor and a ground conductor; and conductive structures that couple the ground conductor to the metal electronic device housing, wherein the metal electronic device housing comprises an internal metal wall and the protruding tail of the flexible printed circuit is bent over the internal metal wall.

22. The apparatus defined in claim 21, further comprising:

a screw that attaches the protruding tail to the internal metal wall and that is configured to electrically couple the ground conductor to the internal metal wall.

23. The apparatus defined in claim 22, further comprising:

an additional screw that attaches the protruding tail to the metal electronic device housing and that electrically couples the ground conductor to the metal electronic device housing.

* * * * *